United States Patent
Homme et al.

(10) Patent No.: US 7,048,967 B2
(45) Date of Patent: May 23, 2006

(54) ORGANIC FILM VAPOR DEPOSITION METHOD AND A SCINTILLATOR PANEL

(75) Inventors: Takuya Homme, Hamamatsu (JP); Toshio Takabayashi, Hamamatsu (JP); Hiroto Sato, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/217,652

(22) Filed: Aug. 14, 2002

(65) Prior Publication Data

US 2002/0192372 A1  Dec. 19, 2002

Related U.S. Application Data

(63) Continuation of application No. 09/737,818, filed on Dec. 18, 2000, which is a continuation-in-part of application No. PCT/JP99/03269, filed on Jun. 18, 1999.

(30) Foreign Application Priority Data

Jun. 18, 1998 (JP) ............................. P10-171192

(51) Int. Cl.
*G01T 1/202* (2006.01)
*C23C 16/458* (2006.01)

(52) U.S. Cl. .................. 427/255.6; 427/65; 427/69; 427/70; 427/160; 427/209; 427/255.7; 250/362; 250/370.11

(58) Field of Classification Search ............... 427/65, 427/69, 70, 160, 255.6, 255.7, 209; 118/728, 118/729, 730; 250/483.1, 486.1, 361 R, 250/362, 370.11
See application file for complete search history.

(56) References Cited

U.S. PATENT DOCUMENTS

| 4,023,039 | A | * | 5/1977 | Galves et al. ............ 250/486.1 |
|---|---|---|---|---|
| 4,269,896 | A | | 5/1981 | Yamagishi ................. 428/411 |
| 5,148,029 | A | | 9/1992 | Persyk et al. ........... 250/361 R |
| 5,168,540 | A | | 12/1992 | Winn et al. ................ 385/144 |
| 5,179,284 | A | * | 1/1993 | Kingsley et al. ....... 250/370.11 |
| 5,187,369 | A | * | 2/1993 | Kingsley et al. ....... 250/370.11 |
| 5,298,294 | A | | 3/1994 | Vieux et al. ................ 427/583 |
| 5,517,031 | A | | 5/1996 | Wei et al. ................ 250/370.8 |
| 5,518,031 | A | | 5/1996 | Castel et al. ............. 137/627.5 |
| 5,641,358 | A | * | 6/1997 | Stewart ..................... 118/715 |
| 5,645,646 | A | * | 7/1997 | Beinglass et al. .......... 118/730 |
| 5,743,956 | A | | 4/1998 | Habuka et al. ............... 117/89 |

FOREIGN PATENT DOCUMENTS

| JP | 59-122988 | 7/1984 |
|---|---|---|
| JP | 61-124574 | 6/1986 |
| JP | 63-215987 | 9/1988 |

(Continued)

*Primary Examiner*—Timothy Meeks
*Assistant Examiner*—Wesley D. Markham
(74) *Attorney, Agent, or Firm*—Drinker Biddle & Reath LLP

(57) ABSTRACT

An organic film vapor deposition method includes a first step of supporting a substrate formed with a scintillator on at least three protrusions of a target-support element disposed on a vapor deposition table so as to keep a distance from the vapor deposition table; a second step of introducing the vapor deposition table having the substrate supported by the target-support element into a vapor deposition chamber of a CVD apparatus; and a third step of depositing an organic film by CVD method onto all surfaces of the substrate, provided with the scintillator, introduced into the vapor deposition chamber.

14 Claims, 5 Drawing Sheets

FOREIGN PATENT DOCUMENTS

| | | |
|---|---|---|
| JP | 63-216000 | 9/1988 |
| JP | 1-267500 | 10/1989 |
| JP | 5-60871 | 3/1993 |
| JP | 5-196742 | 8/1993 |
| JP | 7-174857 | 7/1995 |
| JP | 7-244164 | 9/1995 |
| JP | 8-48595 | 2/1996 |
| JP | 9-13172 | 1/1997 |

* cited by examiner

ORGANIC FILM VAPOR DEPOSITION METHOD AND A SCINTILLATOR PANEL

RELATED APPLICATIONS

This is a Continuation Application of application Ser. No. 09/737,818, filed Dec. 18, 2000, now pending, which is a Continuation-In-Part of International Patent Application Ser. No. PCT/JP99/03269 filed on Jun. 18, 1999.

BACKGROUND OF THE INVENTION

1. Field of the Invention

The present invention relates to an organic film vapor deposition method for depositing a moisture-resistant protective film onto a scintillator panel for medical X-ray photography or the like and the scintillator panel made by this method.

2. Related Background Art

While X-ray sensitive films have been used in medical and industrial X-ray photography, radiation imaging systems using radiation detecting devices have been coming intowider use from the viewpoint of convenience and their storability of photographed results. In such a radiation imaging system, pixel data caused by two-dimensional radiation are acquired by a radiation detecting device as an electric signal, which is then processed by a processing unit, so as to be displayed onto a monitor.

Conventionally known typical radiation detecting devices include those disclosed in Japanese Patent Application Laid-Open No. HEI5-196742 and No. SHO63-2159,87.Such a radiation detecting device forms a scintillator on an imaging device or FOP, such that the radiation incident thereon from the scintillator side is converted by the scintillator into light, so as to be detected.

Here, CsI, which is a typical scintillator material, is high in moisture absorbency and deliquesces by absorbing vapor (moisture) in the air, thereby deteriorating characteristics of the scintillator such as the resolution in particular. Therefore, a moisture-resistant barrier impermeable to water is formed on the upper side of the scintillator layer in the above-mentioned radiation detecting device, so as to protect the scintillator against the moisture.

While a polyparaxylylene film or the like is in use as the moisture-resistant barrier for protecting the scintillator against the moisture, this polyparaxylylene film is deposited by CVD method (vapor phase growth method). When depositing a polyparaxylylene film by CVD method, a planar vapor deposition table or meshed vapor deposition table in a state where a substrate formed with a scintillator is mounted thereon is put into a vapor deposition chamber of a vapor deposition apparatus, whereby the polyparaxylylene film is deposited.

SUMMARY OF THE INVENTION

When the polyparaxylylene film is deposited by the above-mentioned method, however, the polyparaxylylene film is formed not only on the substrate but also on the vapor deposition table, whereby the substrate is harder to take up from the vapor deposition table, and it has been impossible for the polyparaxylylene film to be formed over all surfaces of the substrate formed with the scintillator.

It is an object of the present invention to provide an organic film vapor deposition method for depositing an organic film for protecting a scintillator panel onto all surfaces of a substrate formed with a scintillator.

The present invention is characterized in that it comprises a first step of supporting a substrate formed with a scintillator on at least three protrusions of a target-support element disposed on a vapor deposition table so as to keep a distance from the vapor deposition table; a second step of introducing the vapor deposition table having the substrate supported by the target-support element into a vapor deposition chamber of a CVD apparatus; and a third step of depositing an organic film by CVD method onto all surfaces of the substrate, provided with the scintillator, introduced into the vapor deposition chamber in a state that said substrate is supported so as to keep a distance from said vapor deposition table.

According to the present invention, since the substrate is supported away from the vapor deposition table by the target-support element disposed on the vapor deposition table, the organic film can also be deposited onto the underside of the substrate supported by the sample support, whereby the organic film can be deposited on all surfaces of the substrate including the scintillator by CVD method. Also, the substrate can easily be taken up from the vapor deposition table after the organic film is deposited thereon.

The target-support element of the present invention is characterized in that it is constituted by at least three target-support needles. Also, the target-support is characterized in that it is constituted by a strand member.

Also, the present invention is characterized in that the organic film in the organic film vapor deposition method is a polyparaxylylene film. According to the present invention, the polyparaxylylene film can be deposited on all surfaces of the substrate provided with the scintillator by CVD method.

A scintillator panel according to the present invention has an organic film deposited by the above-mentioned method.

This scintillator panel comprises a substrate, a scintillator formed on the substrate, and an organic film covering substantially all surfaces of the substrate not only over the scintillator side but also over the opposite side. This scintillator panel has good moisture-resistant performance.

The present invention will be more fully understood from the detailed description given hereinbelow and the accompanying drawings, which are given byway of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
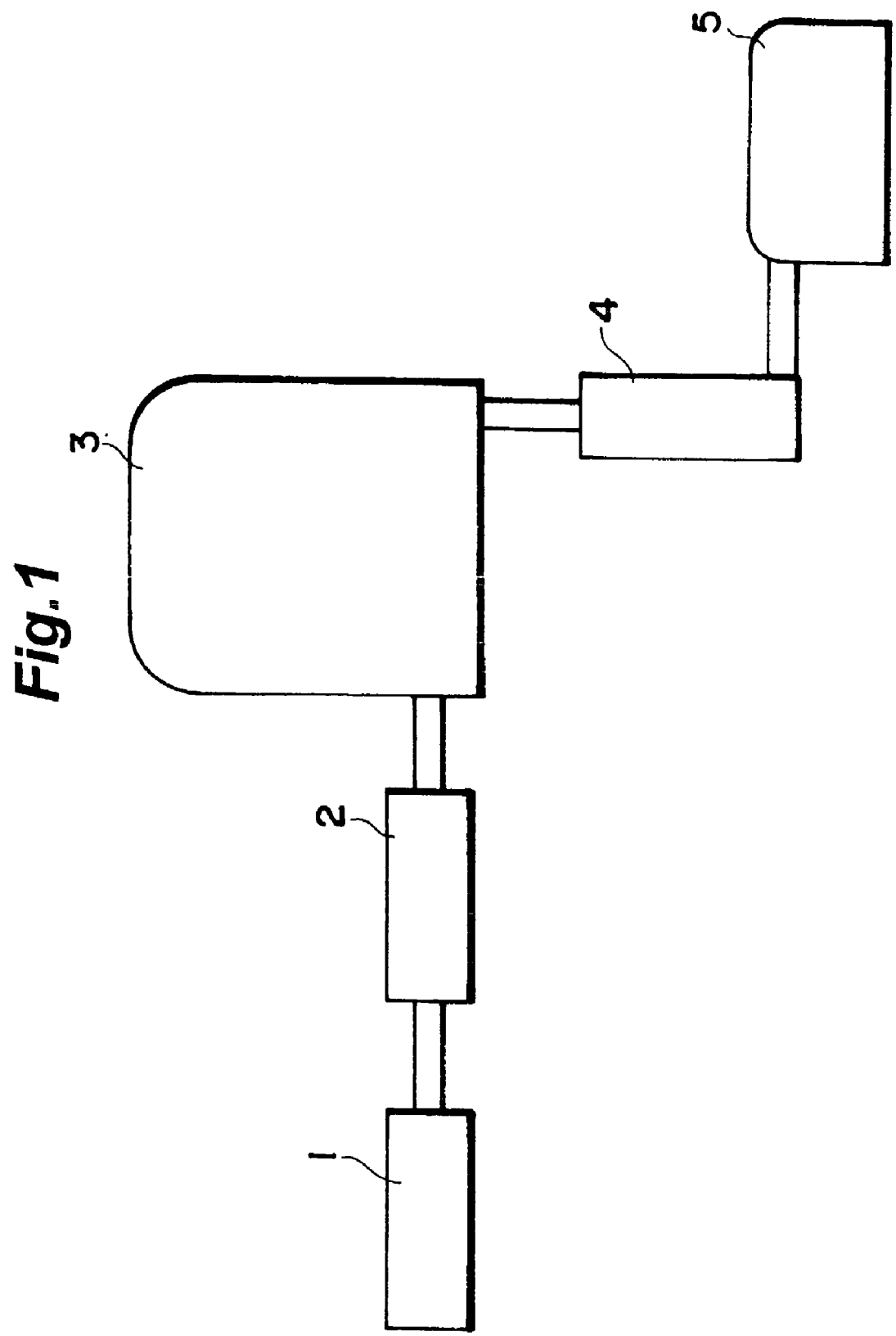
FIG. 1 is a diagram of a polyparaxylylene vapor deposition apparatus in accordance with an embodiment of the present invention.

In the following, a polyparaxylylene film (organic film) deposition method in accordance with an embodiment of the present invention will be explained with reference to the drawings. FIG. 1 is a diagram of a polyparaxylylene vapor deposition apparatus used in the polyparaxylylene film vapor deposition method.

Figure 2:
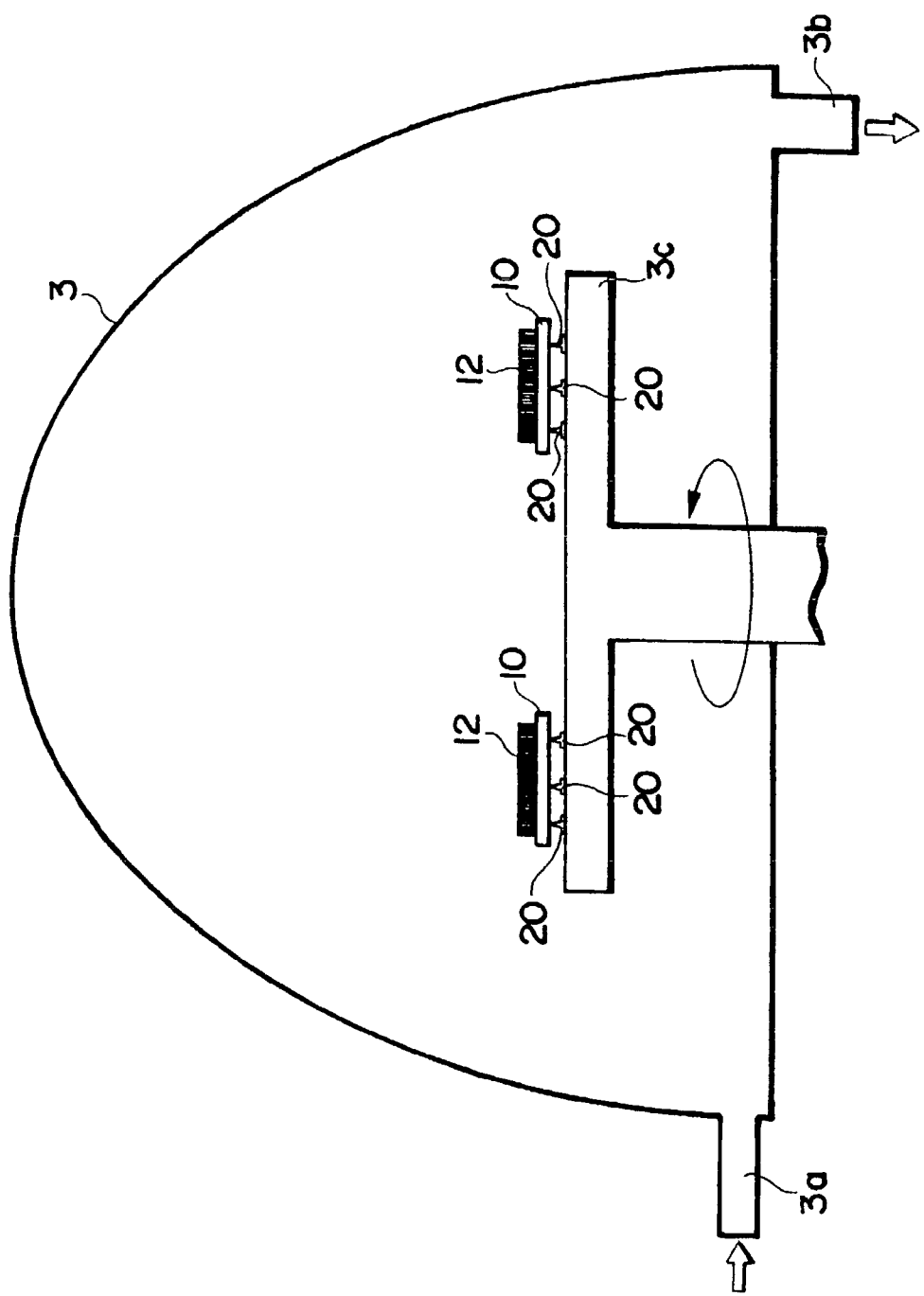
FIG. 2 is a schematic view of the vapor deposition chamber in the polyparaxylylene vapor deposition apparatus in accordance with an embodiment of the present invention.

This polyparaxylylene vapor deposition apparatus comprises a vaporization chamber 1 for receiving and vaporizing diparaxylylene which is a material for polyparaxylylene; a thermal decomposition chamber 2 for heating vaporized diparaxylylene to a higher temperature so as to form a radical therefrom; a vapor deposition chamber 3 for depositing diparaxylylene in a radicalized state onto a substrate formed with a scintillator; a cooling chamber 4 for deodorizing and cooling; and an exhaust system 5 having a vacuum pump. Here, as shown in FIG. 2, the vapor deposition chamber 3 has an inlet 3a for introducing polyparaxylylene radicalized in the thermal decomposition chamber 2 and an outlet 3b for discharging an excess of polyparaxylylene, and also has a turntable (vapor deposition table) 3c for supporting a target onto which a polyparaxylylene film is to be deposited.

Figure 3:
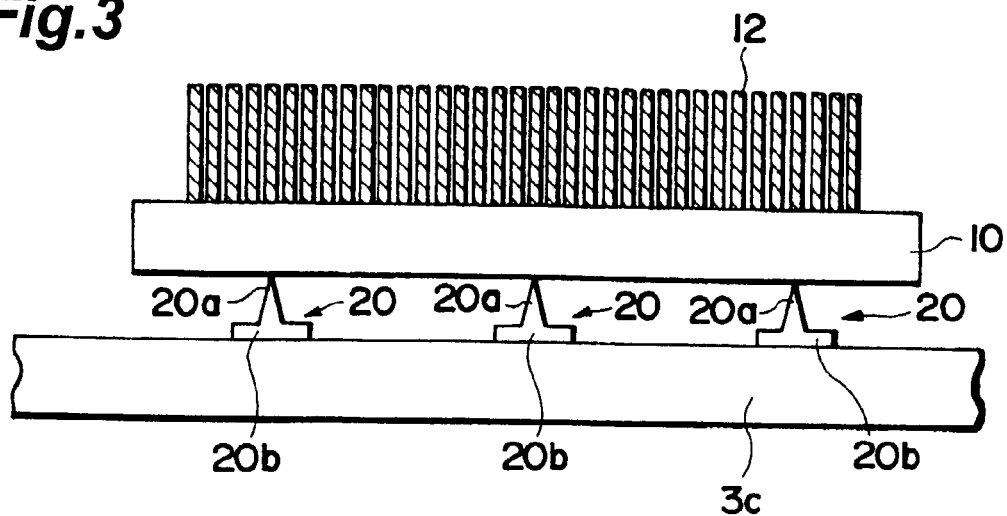
FIG. 3 is a view showing a state where a substrate is supported on a turntable of the polyparaxylylene vapor deposition apparatus in accordance with an embodiment of the present invention.
Figure 4A:
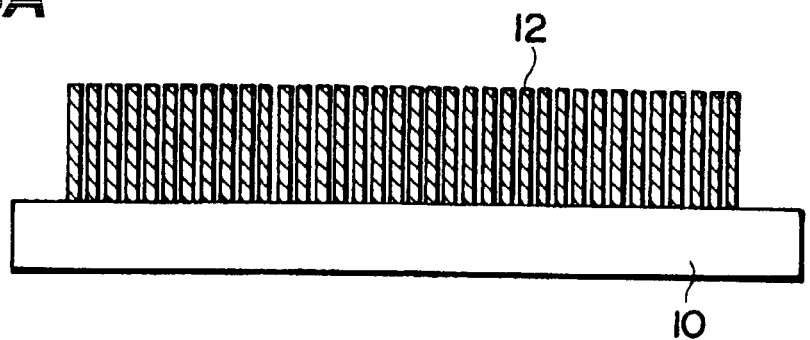
FIG. 4A is a view showing a manufacturing step of a scintillator panel in accordance with an embodiment of the present invention.

First, in the polyparaxylylene vapor deposition apparatus, a disk-shaped or rectangular sheet-like substrate 10 formed with a scintillator 12 is supported on the turntable 3c of the vapor deposition chamber 3 by target-support needles 20. Namely, as shown in FIGS. 2 and 3, the bottom face of substrate 10 is supported by three target-support needles 20 disposed so as to form a substantially equilateral triangle, and is disposed on the turntable 3c. These three target-support needles 20 constitute a target-support element. Here, each target-support needle 20 has a pointed target-support portion 20a at one end and a disk-shaped base portion 20b, in contact with the upper face of the turntable 3c, at the other end. In the substrate 10 formed with the scintillator 12, as shown in FIG. 4A, columnar crystals of CsI doped with Tl are grown by a thickness of 250 μm by a vapor deposition method on one surface of the disk-shaped or rectangular sheet-like substrate 10 (having a thickness of 0.5 mm) made of Al, so as to form the scintillator 12.

Figure 4B:
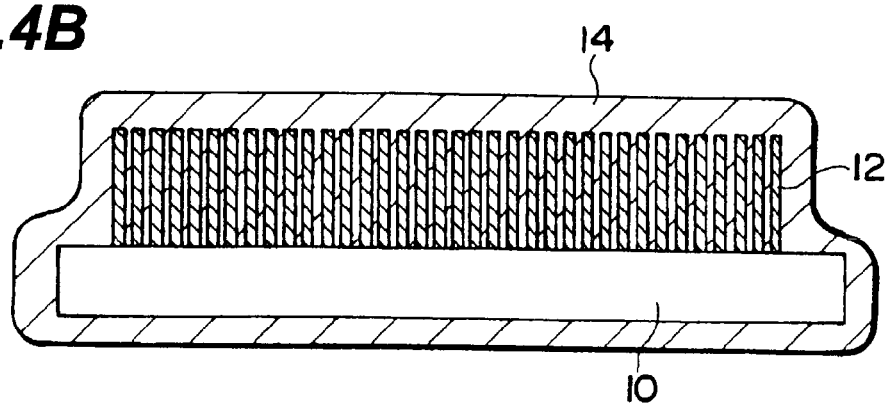
FIG. 4B is a view showing a manufacturing step of the scintillator panel in accordance with an embodiment of the present invention.

Subsequently, the turntable 3c, on which the substrate 10 formed with the scintillator 12 is disposed, is introduced into the vapor deposition chamber 3, whereas diparaxylylene heated to 175° C. and vaporized in the vaporization chamber 1 and then heated to 690° C. and radicalized in the thermal decomposition chamber 2 is introduced into the vapor deposition chamber 3 from the inlet 3a, whereby a first polyparaxylylene film 14 is deposited on all surfaces of the scintillator 12 and substrate 10 by a thickness of 10 μm (see FIG. 4B). Namely, since the substrate 10 formed with the scintillator 12 is supported only by the tip parts of target-support portions 20a of the target-support needles 20 on the turntable 3c, the first polyparaxylylene film 14 can be deposited not only on the surfaces of scintillator 12 and substrate 10, but also on the underside of the substrate 10 and the like, except that support holes are left in the deposited film 14 at the positions where the substrate 10 was supported during deposition of film 14 by the tip parts of the target-support portions 20a of the target-support needles 20, respectively.

In this case, the inside of vapor deposition chamber 3 is maintained at a vacuum of 13 Pa. On the other hand, the turntable 3c is rotated at a speed of 4 rpm so that the first polyparaxylylene film 14 is uniformly deposited. The excess of polyparaxylylene is discharged from the outlet 3b, so as to be led into the cooling chamber 4 for deodorizing and cooling and the exhaust system 5 having a vacuum pump.

Figure 5A:
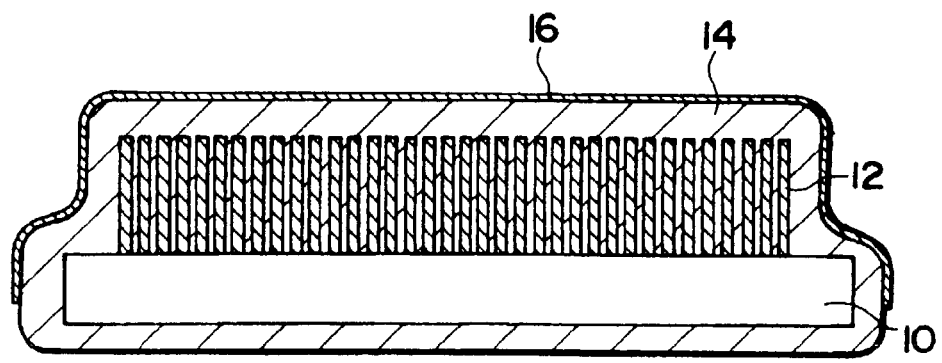
FIG. 5A is a view showing a manufacturing step of the scintillator panel in accordance with an embodiment of the present invention.

Subsequently, the substrate 10 having the first polyparaxylylene film 14 deposited thereon is taken out of the vapor deposition chamber 3, and an $SiO_2$ film 16 is formed on the first polyparaxylylene film 14 on the scintillator 12 side with a thickness of 300 nm by sputtering (see FIG. 5A). Since the $SiO_2$ film 16 is aimed at improving the moisture resistance of scintillator 12, it is formed in an area covering the scintillator 12.

Figure 5B:
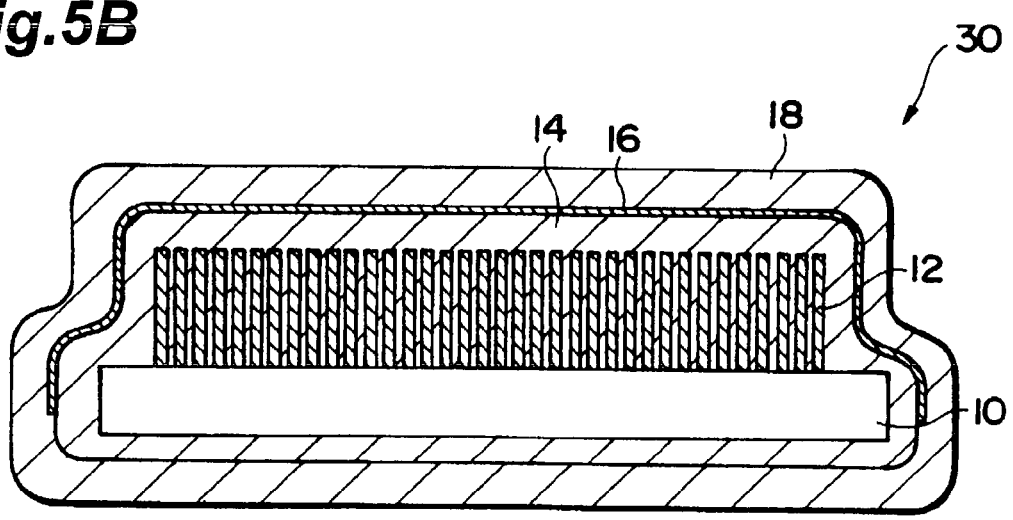
FIG. 5B is a view showing a manufacturing step of the scintillator panel in accordance with an embodiment of the present invention.

Further, a second polyparaxylylene film 18 is deposited with a thickness of 10 μm again by CVD method on the surface of $SiO_2$ film 16 and the surface of first polyparaxylylene film 14 not formed with the $SiO_2$ film 16 on the substrate 10 side (see FIG. 5B). Namely, the substrate 10 is supported by the three target-support needles 20 on the turntable 3c of the vapor deposition chamber 3 in this case as well in a manner similar to that at the time when the first polyparaxylylene film 14 is deposited. That is, in a manner similar to that at the time when the first polyparaxylylene film 14 is deposited, the bottom face of substrate 10 is supported by the three target-support needles 20 disposed so as to form a substantially equilateral triangle, and is disposed on the turntable 3c (see FIGS. 2 and 3). In this case, the substrate 10 is supported such that the position at which the substrate 10 is supported by the target-support needles 20 at the time when the first polyparaxylylene film 14 is deposited and the position at which the substrate 10 is supported by the target-support needles 20 at the time when the second polyparaxylylene film 18 is deposited deviate from each other.

Then, the turntable 3c is introduced into the vapor deposition chamber 3, whereas diparaxylylene heated to 175° C. and vaporized in the vaporization chamber 1 and then heated to 690° C. and radicalized in the thermal decomposition chamber 2 is introduced into the vapor deposition chamber 3 from the inlet 3a, whereby the second polyparaxylylene film 18 is deposited on all surfaces of the scintillator 12 and substrate 10 by a thickness of 10 μm. When this step is completed, the making of a scintillator panel 30 ends. This scintillator panel 30 is used as a radiation detector when an unshown imaging device (CCD) is bonded thereto on the scintillator 12 side and X-rays are made incident thereon from the substrate 10 side.

Since the substrate 10 formed with the scintillator 12 is supported only by the tip parts of target-support portions 20a of the sample support needles 20 on the turntable 3c, the contact area between the bottom face of substrate 10 and the tip parts of target-support portions 20a becomes smaller, whereby polyparaxylylene films can uniformly be deposited on the underside of substrate 10 and the like as well in the polyparaxylylene film vapor deposition method in accordance with this embodiment, except that support holes are left in the deposited film 18 at the positions where the substrate 10 was supported during the deposition of film 18 by the tip parts of the target-support portions 20a of the target-support needles 20, respectively. Also, the substrate 10 can easily be taken up from the turntable 3c after the first and second polyparaxylylene films 14 and 18 are deposited.

Since the position at which the substrate 10 is supported by the target-support needles 20 at the time when the first polyparaxylylene film 14 is deposited and the position at which the substrate 10 is supported by the target-support needles 20 at the time when the second polyparaxylylene film 18 is deposited are shifted from each other, the first and second polyparaxylylene films 14 and 18 can be prevented from peeling off, and the moisture resistance of scintillator 12 can be improved.

Though the substrate 10 formed with the scintillator 12 is supported by three target-support needles 20 in the above-mentioned embodiment, it may also be supported by four or more target-support needles.

Figure 6:
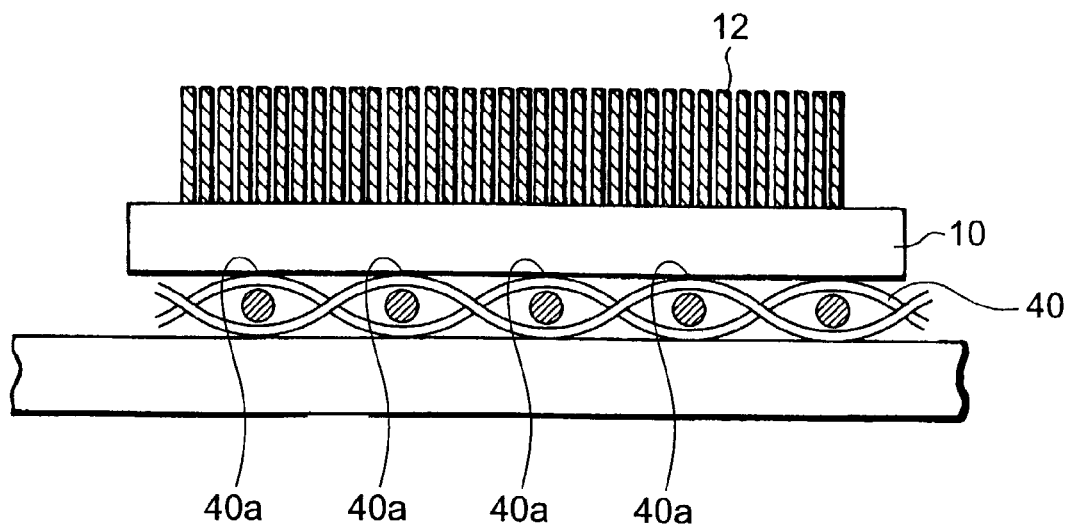
FIG. 6 is a modified example of sample support in accordance with an embodiment of the present invention.

Also, though each target-support needle 20 has a pointed target-support portion 20a at one end and a disk-shaped base portion 20b at the other end in the above-mentioned embodiment, the form of target-support needle 20 can be changed as appropriate as long as it can stably support the substrate 10 on the turntable 3c while yielding a small contact area with the bottom face of substrate 10. For example, the substrate may be supported by a strand member (target-support) 40 as shown in FIG. 6. Since the substrate 10 is supported by at least three protrusions 40a of the strand member 40 in this case as well, the contact area between the bottom face of substrate 10 and the strand member 40 can be made smaller, whereby the polyparaxylylene film can uniformly be deposited on the underside of substrate 10 and the like as well.

Though the $SiO_2$ film 16 is used as a transparent inorganic film in the above-mentioned embodiment, it is not restrictive; and inorganic films made from $SiO_2$, $Al_2O_3$, $TiO_2$, $In_2O_3$, $SnO_2$, MgO, $MgF_2$, LiF, $CaF_2$, AgCl, SiNO, SiN, and the like may also be used.

Though CsI(Tl) is used as the scintillator 12 in the above-mentioned embodiment, it is not restrictive; and CsI(Na), NaI(Tl), LiI(Eu), KI(Tl), and the like may also be used.

Though a substrate made of Al is used as the substrate 10 in the above-mentioned embodiment, any substrate can be used as long as it has a favorable X-ray transitivity, whereby substrates made of amorphous carbon, substrates mainly composed of carbon such as a substrate made of C (graphite), substrates made of Be, substrates made of SiC, and the like may also be used. Also, substrates made of glass, and FOP (fiber optical plate) may be used.

In the above-mentioned embodiment, polyparaxylylene encompasses not only polyparaxylylene but also polymonochloroparaxylylene, polydichloroparaxylylene, polytetrachloroparaxylylene, polyfluoroparaxylylene, polydimethylparaxylylene, polydiethylparaxylylene, and the like.

According to the organic film vapor deposition method of the present invention, organic films can be deposited on all surfaces of the substrate provided with the scintillator, and the substrate can easily be taken up from the turntable after the organic films are deposited.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An organic film vapor deposition method comprising:
    a first step of supporting a multi-sided substrate, having a scintillator formed on a first side of the substrate, on a target-support element, the scintillator being formed of deliquescent material and covering a substantial portion of the first side of the substrate, with at least one portion of the first side of the substrate being uncovered by the scintillator;
    a second step of depositing a first organic film by a CVD method onto substantially all exposed surfaces of said substrate and said scintillator, including a second side of the substrate opposite the first side of the substrate as well as the portion of the first side of the substrate uncovered by the scintillator;
    a third step of depositing a transparent inorganic film on the scintillator side after the first organic film is deposited; and
    a fourth step of depositing a second organic film by a CVD method onto substantially all exposed surfaces of the first organic film deposited in the second step,
    wherein support positions of at least three protrusions of the target-support element in the step of depositing the second organic film are shifted with respect to support positions of protrusions in the step of depositing the first organic film.

2. An organic film vapor deposition method according to claim 1, wherein said target-support element comprises at least three target-support needles upon which the substrate is supported in at least the first step.

3. An organic film vapor deposition method according to claim 1, wherein said target-support element comprises a strand member upon which the substrate is supported in at least the first step.

4. An organic film vapor deposition method according to claim 1, wherein said first organic film comprises a polyparaxylylene film.

5. An organic film vapor deposition method according to claim 1, wherein, during at least the second step, the target support element is disposed on a rotatable vapor deposit table so as to maintain a distance between the substrate with the scintillator formed thereon and the vapor deposition table.

6. An organic film deposition method according to claim 5, wherein the second step of depositing the organic film is performed while the vapor deposition table is rotating.

7. An organic film vapor deposition method according to claim 1, wherein the shifted positions of the protrusions are configured to prevent film peeling.

8. An organic film vapor deposition method according to claim 1, wherein the first step comprises supporting multiple substrates, each formed with a scintillator, on at least three protrusions of respective target-support elements disposed on a vapor deposition table so as to keep a distance from said vapor deposition table; and the second step comprises depositing, while said table is rotating, an organic film by CVD method onto all surfaces of each substrate provided with a scintillator and positioned in a vapor deposition chamber of a CVD apparatus in a state such that each substrate is supported so as to keep a distance from said vapor deposition table.

9. A method of making a scintillator panel comprising the steps of:
    forming a scintillator on a substance; and
    forming films according to claim 1.

10. An organic film vapor deposition method according to claim 1, wherein a step of introducing a rotatable vapor deposition table having said substrate supported by said target-support element thereon into a vapor deposition chamber of a CVD apparatus, is performed between the first and second steps.

11. An organic film vapor deposition method according to claim 1, wherein said scintillator is formed of columnar crystals.

12. An organic film vapor deposition method according to claim 1, wherein, upon completion of said second step, said organic film has at least three support holes located at positions where said substrate was supported by protrusions of said target support member, respectively.

13. An organic film vapor deposition method according to claim 12, wherein the second step results in the organic film completely covering all exposed surfaces of the substrate, except for the support holes.

14. An organic film deposition method according to claim 1, wherein performance of the method results in formation of a scintillator panel including said substrate, said scintillator, and said organic film, and configured to receive a radiation ray entering into said scintillator through said substrate such that light is emitted by said scintillator through said organic films on a side of said substrate opposite a side of said substrate into which said radiation ray enters.

* * * * *